(12) United States Patent
Sasaki et al.

(10) Patent No.: US 7,744,696 B2
(45) Date of Patent: Jun. 29, 2010

(54) METHOD FOR PREPARING BORATE-BASED CRYSTAL AND LASER OSCILLATION APPARATUS

(75) Inventors: Takatomo Sasaki, Suita (JP); Yusuke Mori, Katano (JP); Masashi Yoshimura, Takarazuka (JP); Muneyuki Nishioka, Iwakuni (JP); Satoru Fukumoto, Himeji (JP); Tomoyo Matsui, Tokyo (JP); Takashi Saji, Takefu (JP)

(73) Assignee: Japan Science and Technology Agency, Saitama (JP)

( * ) Notice: Subject to any disclaimer, the term of this patent is extended or adjusted under 35 U.S.C. 154(b) by 565 days.

(21) Appl. No.: 10/545,314

(22) PCT Filed: Feb. 13, 2004

(86) PCT No.: PCT/JP2004/001546

§ 371 (c)(1),
(2), (4) Date: Nov. 16, 2005

(87) PCT Pub. No.: WO2004/079060

PCT Pub. Date: Sep. 16, 2004

(65) Prior Publication Data

US 2006/0102066 A1  May 18, 2006

(30) Foreign Application Priority Data

Feb. 13, 2003  (JP)  ............... 2003-035778
Apr. 14, 2003  (JP)  ............... 2003-109294

(51) Int. Cl.
   *C30B 11/00*  (2006.01)
(52) U.S. Cl. ............... 117/19; 117/11; 117/13; 117/944

(58) Field of Classification Search ............ 117/19, 117/11, 13, 944
See application file for complete search history.

(56) References Cited

U.S. PATENT DOCUMENTS 5,993,545 A * 11/1999 Lupton et al. ............ 117/208

(Continued)

FOREIGN PATENT DOCUMENTS

JP      3-54112      3/1991

(Continued)

OTHER PUBLICATIONS

Patent Abstracts of Japan, English Abstract and computer translation of JP 09-278593 (1997).*

(Continued)

*Primary Examiner*—Robert M Kunemund
*Assistant Examiner*—Matthew J Song
(74) *Attorney, Agent, or Firm*—Wenderoth, Lind & Ponack, L.L.P.

(57) ABSTRACT

A borate-based crystal excellent in uniformity and reliability, which is useful as an optical wavelength conversion device, etc., and can be easily produced at low cost in a short period of time, by the steps of dissolving water-soluble starting materials in water to prepare an aqueous solution, evaporating water in the aqueous solution followed by sintering or evaporating the water and not sintering, thereby forming a crystal growth material, and melting the resultant material to grow a crystal. Further, a highly reliable laser oscillation apparatus can be achieved by using this crystal as an optical wavelength conversion device.

8 Claims, 21 Drawing Sheets

U.S. PATENT DOCUMENTS 6,198,756 B1 * 3/2001 Caprara et al. ................ 372/22
2005/0225837 A1 * 10/2005 Kojima et al. ............... 359/326

FOREIGN PATENT DOCUMENTS

| JP | 5-270989 | 10/1993 |
| JP | 7-89796 | 4/1995 |
| JP | 9-278593 | 10/1997 |
| JP | 09278593 A * | 10/1997 |
| JP | 2002-68891 | 3/2002 |
| WO | WO 0248787 A1 * | 6/2002 |

OTHER PUBLICATIONS

Yusuke Mori et al., "Growth of a nonlinear optical crystal: cesium lithium borate", Journal of Crystal Growth 156 (1995) 307-309.

* cited by examiner

10mm

METHOD FOR PREPARING BORATE-BASED CRYSTAL AND LASER OSCILLATION APPARATUS

TECHNICAL FIELD

The present invention relates to a method for producing a borate-based crystal and a laser oscillation apparatus. More particularly, the invention relates to a novel method for producing a borate-based crystal, which can easily produce a cesium-borate-based crystal useful as an optical wavelength conversion device for converting waves of an Nd:YAG laser or Nd:YVO$_4$ laser to the third harmonic and a cesium-lithium-borate-based crystal useful as an optical wavelength conversion device for converting waves of an Nd:YAG laser or Nd:YVO$_4$ laser to the fourth harmonic with high quality, providing excellent uniformity and reliability at low cost in a short period of time, and relates to a laser oscillation apparatus using this crystal as an optical wavelength conversion device.

BACKGROUND ART

Recently applications of lasers have been expanding to ultraviolet ray lithography, laser micromachining, laser fusion, etc., and laser oscillation apparatuses for use therein need to efficiently produce stable ultraviolet light. All-solid-state laser oscillation apparatuses using nonlinear optical crystals for converting the wavelength of light sources to obtain ultraviolet light have attracted much attention as one way of meeting this need. The nonlinear optical crystals need to have higher output and improved laser damage resistance in order to more efficiently obtaining ultraviolet light.

As nonlinear optical crystals for wavelength conversion to ultraviolet light, for example, lithium-borate-based crystals (LBO crystals: LiB$_3$O$_5$) have been adapted for practical use in converting Nd:YAG laser or Nd:YVO$_4$ laser, wavelength 1064 nm, light to the third harmonic, wavelength 355 nm. However, the LBO crystals have poor surface deterioration and poor wavelength conversion efficiency, so that there has been strong demand for a novel alternative nonlinear optical crystal that does not easily deteriorate and has a high wavelength conversion efficiency. The inventors and other researchers have made extensive studies, and as a result, we have come to see hope in cesium-borate-based crystals (CBO crystals: CsB$_3$O$_5$ as a nonlinear optical crystal alternative to the LBO crystals. The CBO crystals have 2 or more times as large nonlinear optical constant as the LBO crystals and can efficiently generate the third harmonic of the Nd:YAG laser or the Nd:YVO$_4$ laser, whereby they can be put into practical use as high-performance wavelength conversion nonlinear optical crystals. Further, cesium-lithium-borate-based crystals (CLBO crystals: CsLiB$_8$O$_{10}$) proposed by the inventors can produce a shorter wavelength light such as fourth harmonic, wavelength 266 nm, of Nd:YAG laser light, converting this light with a high conversion efficiency and wide temperature and angle tolerance ranges, and we have great expectations for these novel high-performance wavelength conversion nonlinear optical crystals (Reference 1).

Conventionally, borate-based crystals such as CBO crystals and the CLBO crystals are obtained as single crystals by heating and melting carbonate powder, the raw material, and by growing crystals from the obtained crystal growth material using various crystal growth methods. For example, in the case of the CBO crystals, the inventors have directly mixed and heat-melted 26.6 mol % of Cs$_2$CO$_3$ and 73.3 mol % of B$_2$O$_3$, and then grown the CsB$_3$O$_5$ crystal using a Kyropulos technique. However, this method is disadvantageous in that it is not easy to homogenize the composition of the melt, added inclusions are incorporated throughout the crystal volume during the crystal growth to cause strong light scattering and poor laser-induced damage tolerance (Reference 2).

Thus, the inventors then mixed 30 mol % of Cs$_2$CO$_3$ and 70 mol % of B$_2$O$_3$, heat-melted the mixture, and grew CsB$_3$O$_5$ using the combination of a TSSG technique and a solution stirring technique comprising putting a propeller into a solution and rotating the crucible. Though the method can remarkably reduce the light scattering in the grown crystal, the liquid is significantly evaporated near the liquid surface, so that it is difficult to achieve the crystal growth itself, and the crystal cannot be grown over a long period (Reference 3).

In any of the above methods, the starting material powders are directly mixed and used as the growth material for crystal growth, so that the powders generate bubbles due to decarboxylation in the heat melting and swell in the reaction. To prevent this, the powders are mixed and melted gradually in several separate operations. Thus, in the production of the CBO crystals and the CLBO crystals, the starting material powders are beat-melted over several days in a melting furnace and then cooled to ordinary temperature, the resultant crystal growth material is transferred to a growing furnace and melted, and single crystals are grown from the melt. The conventional production of the CBO crystals and the CLBO crystals is thus disadvantageously time-consuming and costly.

The present invention was designed after considering the above, and an object of the invention is to overcome these conventional problems, thereby providing a novel method of easily producing a high-quality borate-based crystal excellent in uniformity, which is useful for optical wavelength conversion device, etc, at low cost in a short period of time, and a laser oscillation apparatus using the crystal as an optical wavelength conversion device Reference 1: Y. Mori, et al., "New nonlinear optical crystal: Cesium lithium borate", Appl. Phys. Lett, 67, 13 (1995) 1818, Reference 2: Y. Kagebeyashi, Y. Mori and T. Sasaki, "Crystal growth of cesium triborate, CsB$_3$O$_5$ by Kyropulos technique", Bulletin of Materials Science, Vol. 22 (6) pp. 971-973, 1999

Reference 3: R. Kitano "Efficient 355-nm generation in CsB3O5 crystal", Optics Letters, Vol. 28, No. 4, pp. 263-265, 2003.

DISCLOSURE OF INVENTION

To solve the above problems, according to a first aspect of the present invention, there is provided a method for producing a borate-based crystal which comprises dissolving water-soluble starting materials in water to prepare an aqueous solution, evaporating the water in the aqueous solution and then sintering or evaporating the water and not sintering, to form a crystal growth material, and melting the resultant material to grow a crystal.

According to a second aspect of the invention, there is provided a method for producing a borate-based crystal of the first aspect, wherein a water-soluble cesium compound and a water-soluble boron compound are used as the starting materials to grow a cesium-borate-based crystal. According to a third aspect of the invention, there is provided a method for producing a borate-based crystal wherein a water-soluble compound of at least one alkaline metal or alkaline earth metal other than cesium is dissolved in water together with the cesium compound and the boron compound to grow a cesium-borate-based crystal of the composition formula:

$$Cs_{1-x}M_xB_3O_5 \ (0 \leq x < 1)$$

wherein M is the alkaline metal or alkaline earth metal element.

Further, according to a fourth aspect of the invention, there is provided a method for producing a borate-based crystal of the first aspect, wherein a water-soluble cesium compound, a lithium compound, and a boron compound are used as the starting materials to grow a cesium-lithium-borate-based crystal. According to a fifth aspect of the invention, there is provided a method for producing a borate-based crystal wherein a water-soluble compound of at least one alkaline metal or alkaline earth metal other than cesium or lithium is dissolved in water together with the cesium compound, the lithium compound, and the boron compound to grow a cesium-lithium-borate-based crystal of the composition formula:

$$Cs_{1-x}Li_{1-y}M_{x+y}B_6O_{10} \ (0 \leq x, y < 1) \text{ or}$$

$$Cs_{2(1-z)}Li_2M_{2z}B_{12}O_{20} \ (0 < z < 1)$$

wherein M is an alkaline metal or alkaline earth metal element.

Additionally, according to a sixth aspect of the invention, there is provided a method for producing a borate-based crystal of any one of the above aspects, wherein the water-soluble cesium compound is a carbonate compound. According to a seventh aspect, there is provided a method characterized in that the water-soluble boron compound is boron oxide or boric acid. According to a eighth aspect, there is provided a method wherein the aqueous solution is heated to evaporate the water. According to a ninth aspect, there is provided a method wherein the sintering is carried out at a temperature equal to or higher than 500° C. and lower than the melting temperature after evaporating the water in the aqueous solution. According to a tenth aspect there is provided a method wherein the melted crystal growth material is stirred during the crystal growth. According to an eleventh aspect, there is provided a method wherein the grown crystal is heated to reduce water impurities in the crystal. According to a twelfth aspect, there is provided a method wherein the grown crystal is heated at 100° C. or higher. According to a thirteenth aspect, there is provided a method wherein the grown crystal is heated in a gas-substituted atmosphere or an evacuated atmosphere.

Further, according to a fourteenth aspect of the invention, there is provided a laser oscillation apparatus comprising a borate-based crystal produced by the method of any one of the above aspects as an optical wavelength conversion device.

Figure 1:
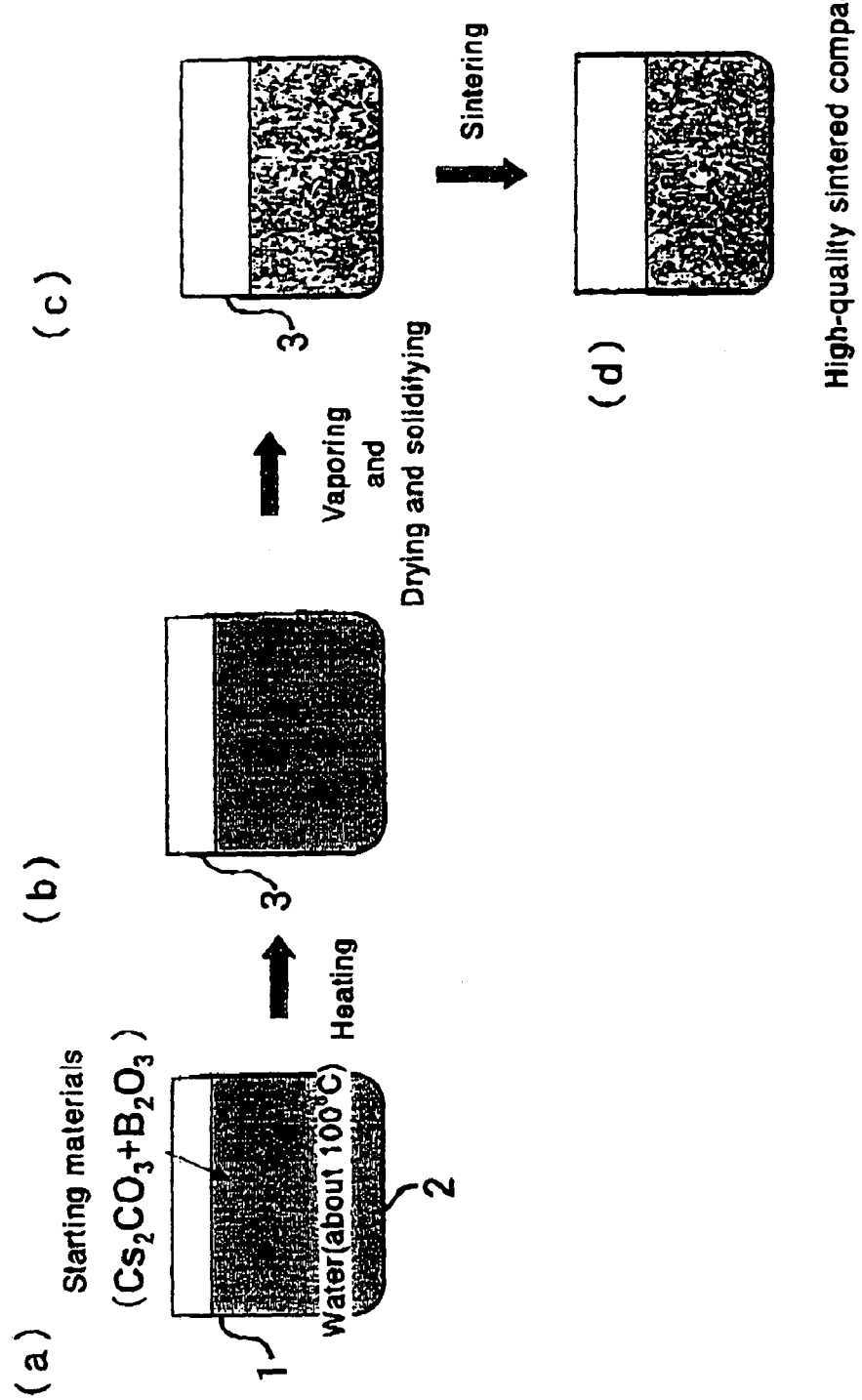
FIG. 1 is a schematic view illustrating the steps of producing a sintered body of a borate-based crystal according to the method of the present invention.

Reference numerals in the drawings represent the following.

1 Polymethylpentene vessel
2 Ion exchange water
3 Crucible
4 Heater
5 Cylindrical resistance heating furnace
6 Small opening
7 Seed crystal
8 Seed crystal-holding rod
9 Melted substance
10 Nd:YVO$_4$ laser
11 Nonlinear optical crystal

BEST MODE FOR CARRYING OUT THE INVENTION

The present invention is characterized by the above aspects, and an embodiment of the invention is described below.

The method for producing a borate-based crystal according to the invention is characterized by comprising the steps of dissolving water-soluble starting materials in water to prepare an aqueous solution, evaporating water in the aqueous solution followed by sintering or evaporating the water and not sintering, thereby forming a crystal growth material, and melting the resultant crystal growth material to grow a crystal.

This method is based on the new knowledge made as a result of research by the inventors that, in production of borate-based crystals such as cesium-borate-based crystals (CBO crystals) and cesium-lithium-borate-based crystals (CLBO crystal, uniform mixing for preparation of the crystal growth materials is an important factor determining the quality of the crystals. Even in the case of using a carbonate compound as a starting material, it is important to put carbonic acid in an easily removable state, thereby making the uniform mixing easy.

Thus, the inventors have taken notice of the water solubility of cesium and lithium, which are main elements of a borate-based crystal along with boron, and have found that an aqueous solution with a uniform composition can be obtained by mixing the water-soluble starting materials cesium compound, lithium compound, and boron compound at a predetermined ratio, and adding water thereto to form an aqueous solution in which the starting materials are uniformly mixed on the molecular size level in water. The aqueous solution is subjected to evaporation and solidification, and sintered if necessary, to prepare a crystal growth material, and the resultant material is melted to grow a crystal, so that a transparent borate-based crystal with few light scattering centers can be obtained.

More specifically, for example, a water-soluble cesium compound and a water-soluble boron compound are dissolved in water to prepare an aqueous solution in the case of producing the CBO crystal, and a water-soluble cesium compound, a lithium compound, and a boron compound are dissolved in water to prepare an aqueous solution in the case of producing a CLBO crystal. Water in the aqueous solution is evaporated, and the resulting substance is sintered or used as is to prepare a crystal growth material, which is melted to grow a crystal.

Further, in the method of the invention, a water-soluble compound of at least one alkaline metal or alkaline earth metal other than cesium or lithium may be dissolved in water. More specifically, for example in the production of the cesium-borate-based crystal, the cesium (Cs) in the composition of $CsB_3O_5$ may be replaced by an alkaline metal element other than cesium such as sodium (Na), potassium (K), and rubidium (Rb) or an alkaline earth metal element such as barium (Ba), strontium (Sr), calcium (Ca), and magnesium (Mg), to obtain a crystal having the composition formula:

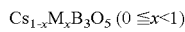
$Cs_{1-x}M_xB_3O_5$ (0 ≦x<1)

wherein M is an alkaline metal or alkaline earth metal element. In production of the cesium-lithium-borate-based crystal, part of cesium and lithium in the composition of $CsLiB_6O_{10}$ may be replaced by any alkaline metal or alkaline earth metal element as above, to obtain a crystal having the composition formula:

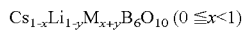
$Cs_{1-x}Li_{1-y}M_{x+y}B_6O_{10}$ (0 ≦x<1)

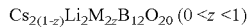
$Cs_{2(1-z)}Li_2M_{2z}B_{12}O_{20}$ (0<z<1)

wherein M is an alkaline metal or alkaline earth metal element. For example, compositions satisfying 0<x0.01 with the alkaline metal element (M) of Na (sodium), compositions satisfying 0<x≦0.1 when M is K (potassium), and compositions satisfying 0<x≦1 when M is Rb (rubidium) are preferred from the viewpoints of production, physical properties, etc. The composition may of course contain any alkaline metal elements and alkaline earth metal elements if they are within the above range.

Thus, the alkaline metal or the alkaline earth meta, other than cesium, or cesium and lithium, is present in the state of an ion in the crystal structure, whereby the refractive index of the formed crystal can be changed to improve the phase matching angle, angle tolerance, temperature tolerance, etc., and also the structure of the crystal can be changed to obtain a more stable crystal which is difficult to crack, does not get cloudy, etc.

As is clear from the above description, the cesium-borate-based crystal used in the invention includes the oxide crystal of only cesium and borate having the composition of $CsB_3O_5$, and the crystals having the composition of $Cs_{1-x}M_xB_3O_5$, wherein part of cesium in $CsB_3O_5$ is replaced by an alkaline metal or alkaline earth metal element (M) other than cesium. The cesium-lithium-borate-based crystal used in the invention includes the oxide crystal of only cesium, lithium, and borate having the composition of $CsLiB_6O_{10}$, and the crystals having the composition of $Cs_{1-x}Li_{1-y}M_{x+y}B_6O_{10}$ or $Cs_{2(1-z)}Li_2M_{2z}B_{12}O_{20}$, wherein part of cesium and lithium in $CsLiB_6O_{10}$ is replaced by another alkaline metal or alkaline earth metal element (M).

In the invention, the starting materials are dissolved in water to form a uniform aqueous solution, and thereby are made minute and uniform, aiding in the preparation of the crystal growth material. Examples of the water-soluble compounds of cesium, lithium, and the other alkaline metal and alkaline earth metal elements, used as the starting materials in this invention, include inorganic acid salts such as carbonates and organic acid salts such as acetates thereof. Particularly when a water-soluble cesium or lithium carbonate compound is used as the starting material and dissolved in water, carbonic add can be easily removed, and thus bubbles due to decarboxylation in the step of firing or dissolving can be reduced. Preferred boron compounds include water-soluble boron oxide and boric acid which are easily dissolved in water, since by using these compounds the starting materials can be uniformly mixed with great ease, though another water-soluble boron compound may be used.

The starting materials are preferably in the powder state to facilitate dissolving in water, though the state of the starting materials is not particularly limited in the invention. It is preferred that the starting materials such as the cesium carbonate compound, the lithium carbonate compound, and boron oxide (or boric acid) be simultaneously mixed with water. It has been confirmed that, as a result of research by the inventors, the method of simultaneously mixing the starting materials per se with water is more preferable than the method of mixing aqueous solutions, which are separately prepared by dissolving each material with water. The amount of water for dissolving the starting materials is preferably 1.0 to 2.5 times the total weight of the starting materials for the cesium-borate-based crystal, and is preferably 1.2 to 25 times the total weight or the starting materials for the cesium-lithium-borate-based crystal. The amount is more preferably 1.5 to 2 times the total weight of the starting materials in both cases. When the amount of water is less than 1.0 or 1.2 times the total weight, it takes more effort to completely dissolve the starting materials. It should be noted that, in a case where the starting materials are not easily dissolved, the solubility may be increased by heating the aqueous solution. On the other hand, when the amount of water is more than 2.5 times the total weight, the aqueous solution can be easily prepared but the next step of evaporating water is tithe-consuming.

The ratio between the starting materials depends on the kinds of the materials, the amount of water, etc. In the case of using cesium carbonate ($Cs_2CO_3$) with boron oxide ($B_2O_3$) or boric acid ($H_3BO_3$) for forming the cesium-borate-based crystal, the mole ratio of Cs:B is preferably 1:2.13-4.56. In the case of using cesium carbonate ($Cs_2CO_3$), lithium carbonate ($Li_2CO_3$), and boron oxide ($B_2O_3$) or boric add ($H_3BO_3$) for forming the cesium-lithium-borate-based crystal, the mole ratio of Cs:Li:B is preferably 1:1:3-10. In the other cases, these ratios may be used as standards.

In the invention, after the preparation of the aqueous solution, water is evaporated. The water may be evaporated naturally, but if the aqueous solution is heated, this also completely dissolves and mixes the material. Thus, in contrast to mechanical pulverization and mixing by a ball grinding mill, etc., the materials can be mixed and uniformized down to a microscopic level by using the procedure of the invention. Further, the method of the invention is in no danger of composition unevenness due to contamination of impurities.

A solid is obtained by evaporating the water of the uniformly mixed aqueous solution, where the starting materials are uniformly mixed down to the molecular level. In the invention, the solid may be either sintered or used as is to obtain the crystal growth material. The sintering is preferably carried out at a temperature of 500° C. or higher and lower than the melting temperature, and more practically the sintering temperature is preferably 500 to 700° C. The sintering time may be approximately 10 minutes, and a few hours of sintering is sufficient even if a complete removal of hydrates is considered, though the sintering time depends on the amounts and dryness of the materials, etc. In the case of using a carbonate compound as the starting material, the swelling of the material due to decarboxylation is hardly observed at all in the sintering step. Thus, large amounts of the materials can be put in a crucible at once, whereby the production time can be remarkably reduced to approximately ⅕ that of conventional methods, and cost reduction can be achieved thereby. Further, the CBO crystal and the CLBO crystal having remarkably excellent crystallinity can be obtained because the starting materials are uniformly mixed at the molecular level. Also, large crystals can be produced by growth for a long period of time.

More specifically, for example in a case where the water-soluble cesium compound of the carbonate compound ($Cs_2CO_3$) and the water-soluble boron compound of boron oxide ($B_2O_3$) am dissolved in water to form the cesium-borate-based crystal by the method of the invention, a decarboxylation reaction represented by the following formula occurs via neutralization.

$B_2O_3 + H_2O \rightarrow 2HBO_2$ $Cs_2CO_3 + 2HBO_2 \rightarrow 2CsBO_2 + H_2O + CO_2\uparrow$ In the case of producing the cesium-lithium-borate-based crystal by the method of the invention, the water-soluble lithium compound of the carbonate compound ($Li_2CO_3$) is further added, whereby a decarboxylation reaction represented by the following formula occurs in addition to that of the above formula.

$Li_2CO_3 + 2HBO_2 \rightarrow 2LiBO_2 + H_2O + CO_2\uparrow$

In conventional production of the CBO crystals and the CLBO crystals, such decarboxylation reactions occurs in the sintering step, when the viscosity of the melt is remarkably high, so that the melt undergoes extreme swelling. However, in the invention, the decarboxylation reactions occur in the aqueous solution, whereby swelling of the starting materials is not caused and large amounts of materials can be treated at once. After the neutralization, the water is evaporated naturally or by heating to solidify the mixture, thereby forming $CsBO_2$ and $LiBO_2$ mixed uniformly on the microscopic level. Then, sintering is performed again, whereby the $CsB_3O_5$ crystal is obtained by the reaction:

$CsBO_2 + B_2O_3 \rightarrow CsB_3O_5$ in the CBO crystal production, and the $CsLiB_6O_{10}$ crystal is obtained by the reaction:

$CsBO_2 + LiBO_2 + 2B_2O_3 \rightarrow CsLiB_6O_{10}$ in the CLBO crystal production, the crystals being minute and uniform on the microscopic level.

It is however not necessary to carry out the sintering, and regardless of whether the sintering is carried out or not, the obtained crystal growth material is melted to grow a crystal in the invention. The crystal growth may be achieved by heating to the melting temperature or more and then using one of various growing methods.

The thus produced melt has crystallinity very similar to a single crystal, and thereby may be solidified as is and used in various applications. Alternatively, the melt may be used for growing a single crystal by known crystal growth methods. In this case, a high-quality single crystal can be grown.

In the invention, it is not necessary to prepare the melt in a melting furnace as the conventional methods. Thus, the melt may be prepared in a growing furnace, and single crystals may be grown successively.

By stirring the melt of the crystal growth material in the crystal growth process, the melt can be further uniformized, so that advantageous effects including increase in the laser damage threshold of the crystal and reduction of the variation of the laser damage threshold can be achieved. For example, the step of stirring the melt may be carried out by rotating a seed crystal around the axis of a seed crystal-holding rod and rotating the crucible in the opposite direction to that of the seed crystal and reversing their direction of rotation periodically, of the be inserting a blade part into the melt and rotating it together with the crucible, etc.

In the method for producing a borate-based crystal of the invention, the grown crystal may be heated as described above to reduce water impurities in the crystal. In the course of research by the inventors, it has been made clear that not only the borate-based crystal produced according to the invention but also conventional borate-based crystals contain impurities of water not on the adsorption surface but inside the crystal. As a result of further intense research, the inventors have found that the damage threshold level for ultraviolet laser light is improved by reducing the water impurities in the crystal. The above heating step is based on this radically new discovery. The laser damage threshold level is increased as the water impurities in the crystal are reduced. For example, when the borate-based crystal grown according to the invention is heated simply by a heater at a temperature of 100° C. or higher, e.g. 150° C., the water impurities are gradually reduced and the laser damage threshold is gradually increased therewith, this increase becoming slight after approximately 100 hours. The damage threshold level for the ultraviolet laser can be increased by approximately 1.35 times by heating at 150° C. for 100 hours or more. The heating step may be carried out by using any of various kinds of heating means instead of simple beaters, and the heating units may be used in a gas-substituted atmosphere or an evacuated atmosphere.

According to the crystal production method of the invention, the borate-based crystal can be easily produced at low cost in a short period of time. Further, the starting materials can be uniformly mixed on the molecular size level, whereby the resulting crystal has transparency, high quality with uniform composition and remarkably little light scattering, and high laser damage tolerance. Thus, for example, when the cesium-borate-based crystal produced by the method of the invention is used in a laser oscillation apparatus as a nonlinear optical crystal for wavelength conversion (an optical wavelength conversion device), the crystal undergoes no laser damage in the step of low output ultraviolet light generation unlike conventional cesium-borate-based crystals, and shows output far larger than that of lithium-borate-based crystals, so that it is useful as a third harmonic generation device for Nd:YAG laser and Nd:YVO$_4$ laser, etc. When the cesium-lithium-borate-based crystal according to the invention is used in a laser oscillation apparatus as a nonlinear optical crystal for wavelength conversion, the crystal undergoes smaller laser damage in the step of low output ultraviolet light generation than fused quartz and conventional cesium-lithium-borate crystals and threshold distribution width is stable, so that it is useful as a fourth harmonic generation device as well as a third harmonic generation device. Thus, by using the borate-based crystal obtained by the method of the invention as an optical wavelength conversion device, ultraviolet light can be stably and efficiently obtained and a more reliable laser oscillation apparatus can be provided. This is extremely important for creating a high-performance ultraviolet laser system using a borate-based crystal.

The embodiments of the invention will be explained in more detail below referring to Examples with attached drawings. The invention is not limited to following Examples, and it will be obvious that various changes may be made in the details.

EXAMPLES

Example 1

A cesium-borate-based crystal was produced according to an embodiment of the method for producing a borate-based crystal of the invention.

First as shown in FIGS. 1(*a*) to 1(*d*), ion exchange water (2) was put in a polymethylpentene vessel (1) having a diameter of 20 cm and a height of 26 cm and heated to about 100° C. by a melting furnace, a uniform mixture of 4337.4 g of $Cs_2CO_3$ and 2162.6 g of $B_2O_3$ was added thereto and dissolved, and the water was evaporated by continued heating. Then, after evaporating the water, the residual material was charged in an open platinum crucible (3) having a diameter of 15 cm and a height of 15 cm, dried and solidified by heating at 300° C., and burned at 650° C. to obtain a crystal growth material. The crucible (3) was put in a five-layer-control cylindrical resistance heating furnace (5) for crystal growth having heaters (4) shown in FIG. 2, and the upper opening of the cylindrical resistance heating furnace (5) was sealed by a heat insulating material having a small opening (6) for transferring a seed crystal at a portion corresponding to the center of the crucible (3).

Next, the inner temperature of the furnace was raised to 850° C. to melt the crystal growth material, the same temperature was maintained for 1 hour, a stirring rod comprising an alumina bar with a platinum plate fixed to its lower end was introduced into the melt, and the melt was stirred for 24 hours. Then, the inner temperature of the furnace was lowered to 787.5° C., and as shown in FIG. 3, a $CsB_3O_5$ seed crystal (7) cut along the a-axis was fixed to the lower end of a seed crystal-holding rod (8) by a platinum wire, and the seed crystal (7) was introduced into the crucible (3) through the small opening (6) formed in the upper portion of the cylindrical resistance heating furnace (5) shown in FIG. 2, and brought into contact with the liquid surface of the melt (9). The seed crystal-holding rod (8) was rotated while slowly cooling at a rate of 0.1° C./day to grow a crystal from the seed crystal (7). The rotating speed was 60 rpm, and the rotating direction was reversed every 3 minutes.

After 10 days, when the crystal growth was completed, the crystal was separated from the liquid of the melt (9) and slowly cooled to room temperature at a cooling speed of 20° C./h, to obtain a transparent single $CsB_5O_5$ crystal of 10×19× 19 mm$^3$ in size

Example 2

A cesium-borate-based crystal was produced under conditions different from those of Example 1 according to the method of the invention, and the cesium-borate-based crystal was used as a nonlinear optical crystal and evaluated with respect to the properties.

As shown in FIG. 1, ion exchange water (2) was put in a polymethylpentene vessel (1) having a diameter of 20 cm and a height of 26 cm and heated to about 100° C. by a melting furnace, a uniform mixture of 4671.1 g of $Cs_2CO_3$ and 2328.9 g of $B_2O_3$ was added thereto and dissolved, and the water was evaporated by continuing the heating.

Figure 4:
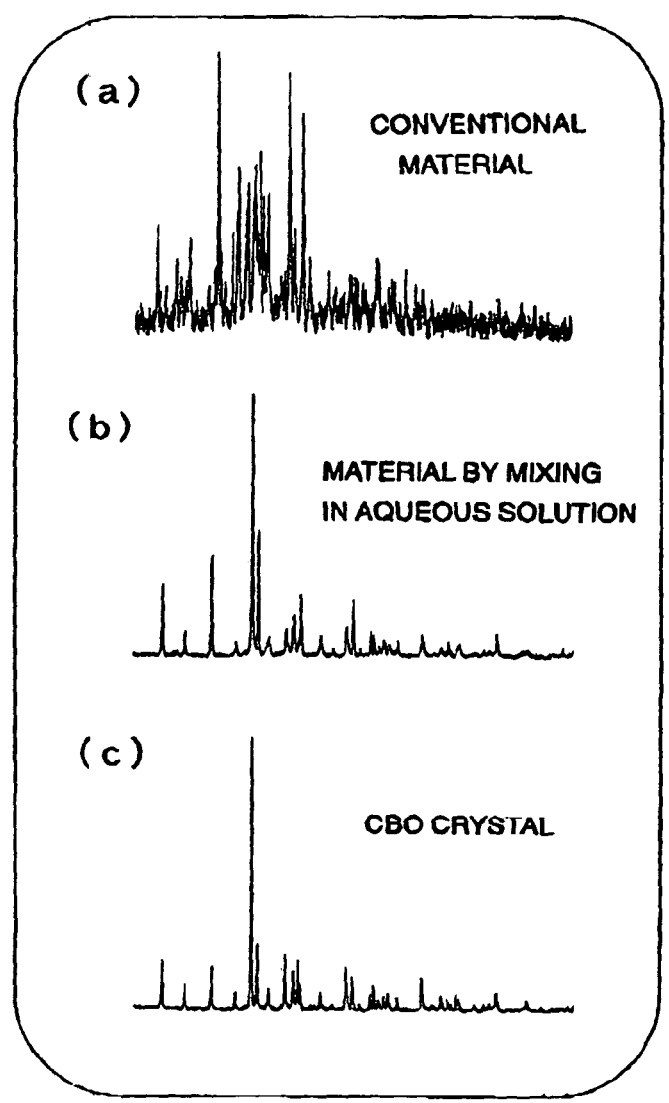
FIG. 4 is a graph illustrating the results of XRD measurement of (a) a conventional crystal growth material, (b) the crystal growth material of the invention, and (c) a CBO single crystal.

After evaporating the water, the residual material was charged in an open platinum crucible (3) having a diameter of 15 cm and a height of 15 cm, dried and solidified by heating at 300° C., and sintered at 650° C. As a result of subjecting thus obtained crystal growth material to an XRD measurement, hardly anything but the peaks of CBO crystal are observed as shown in FIG. 4(*b*). FIG. 4(*a*) shows the XRD measurement result of a comparative crystal growth material, which was prepared by a conventional method in which the starting material powders are directly mixed and sintered. Many peaks other than those of the CBO crystal are present in FIG. 4(*a*). FIG. 4(*c*) shows the XRD measurement results of an ideal CBO crystal.

Figure 2:
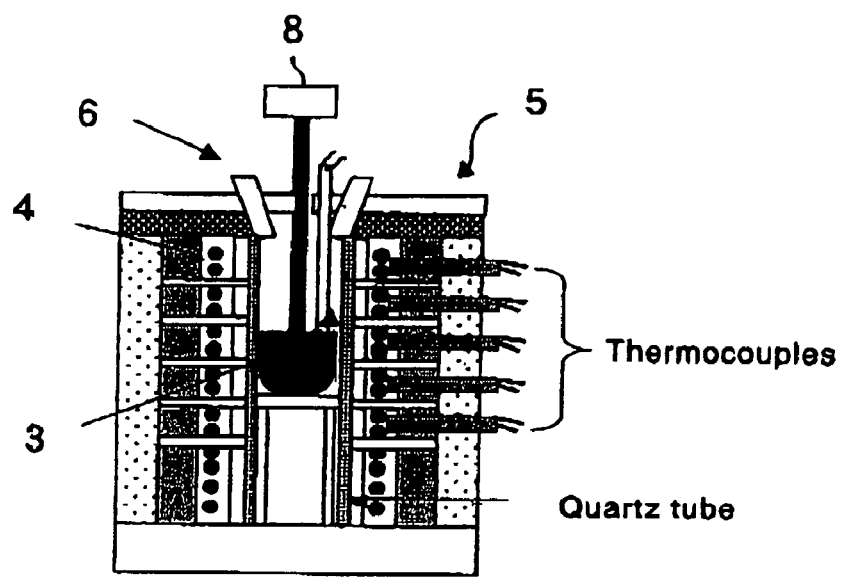
FIG. 2 is a view illustrating an embodiment of a cylindrical resistance heating furnace for growing the borate-based crystal of the invention.
Figure 3:
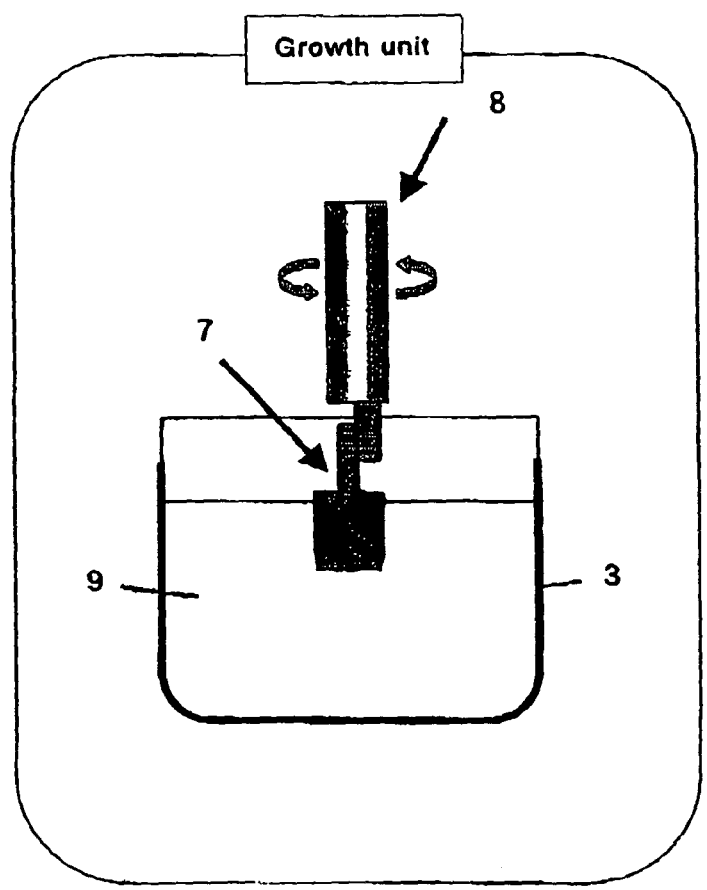
FIG. 3 is a side view illustrating details of growth of the borate-based crystal of the invention.

Then the crucible (3) was put in a cylindrical resistance heating furnace (5) for crystal growth having heaters (4) shown in FIG. 2, and the upper opening of the cylindrical resistance heating furnace (5) was sealed by a heat insulating material having a small opening (6) for transferring a seed crystal at a portion corresponding to the center of the crucible (3).

The inner temperature of the furnace was raised to 850° C. to melt the crystal growth material, the same temperature was maintained for 3 hours, a stirring rod comprising an alumina bar and a platinum plate fixed to the lower end thereof was introduced into the melt, and the melt was stirred for 12 hours. Then, the inner temperature of the furnace was lowered to 788° C., and as shown in FIG. 3, a $CsB_3O_5$ seed crystal (7) cut along the a-axis was fixed to the lower end of a seed crystal-holding rod (8) by a platinum wire, and the seed crystal (7) was introduced into the crucible (3) through the small opening (6) formed in the upper portion of the cylindrical resistance heating furnace (5), and brought into contact with the liquid surface of the melt (9). The seed crystal-holding rod (8) was rotated while slowly cooling at a rate of 0.1° C./day to grow a crystal from the seed crystal (7). The rotating speed was 60 rpm, and the rotating direction was reversed every 3 minutes.

Figure 5:
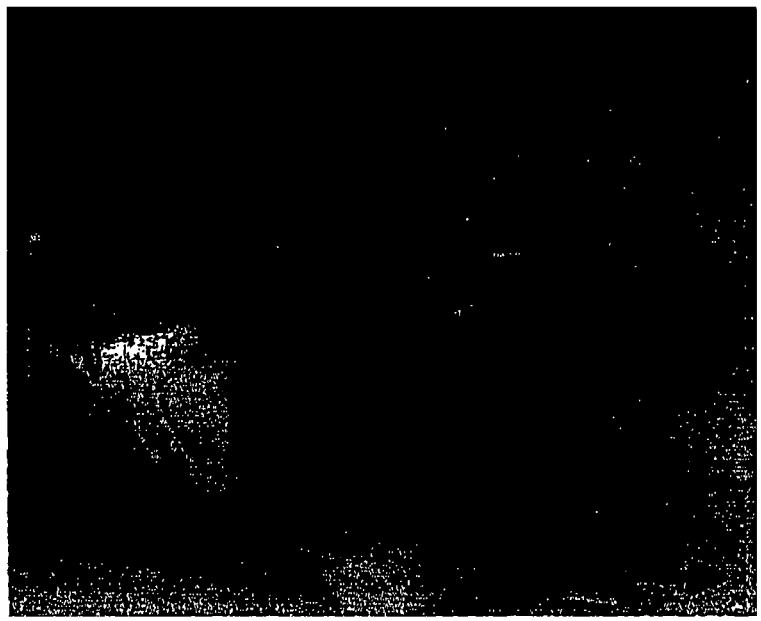
FIG. 5 is a view based on a photograph showing a cesium-borate-based crystal produced by the method of the invention.

After 16 days, when the crystal growth was completed, the crystal was separated from the melt liquid, and slowly cooled to room temperature at a cooling speed of 16° C./h, to obtain a transparent single CsB₃O₅ crystal of 25×30×30 mm³ in size. FIG. 5 is a photograph showing an example of the CBO crystal obtained according to the invention, clearly showing that the CBO crystal obtained by the method of the invention was transparent.

Figure 6:
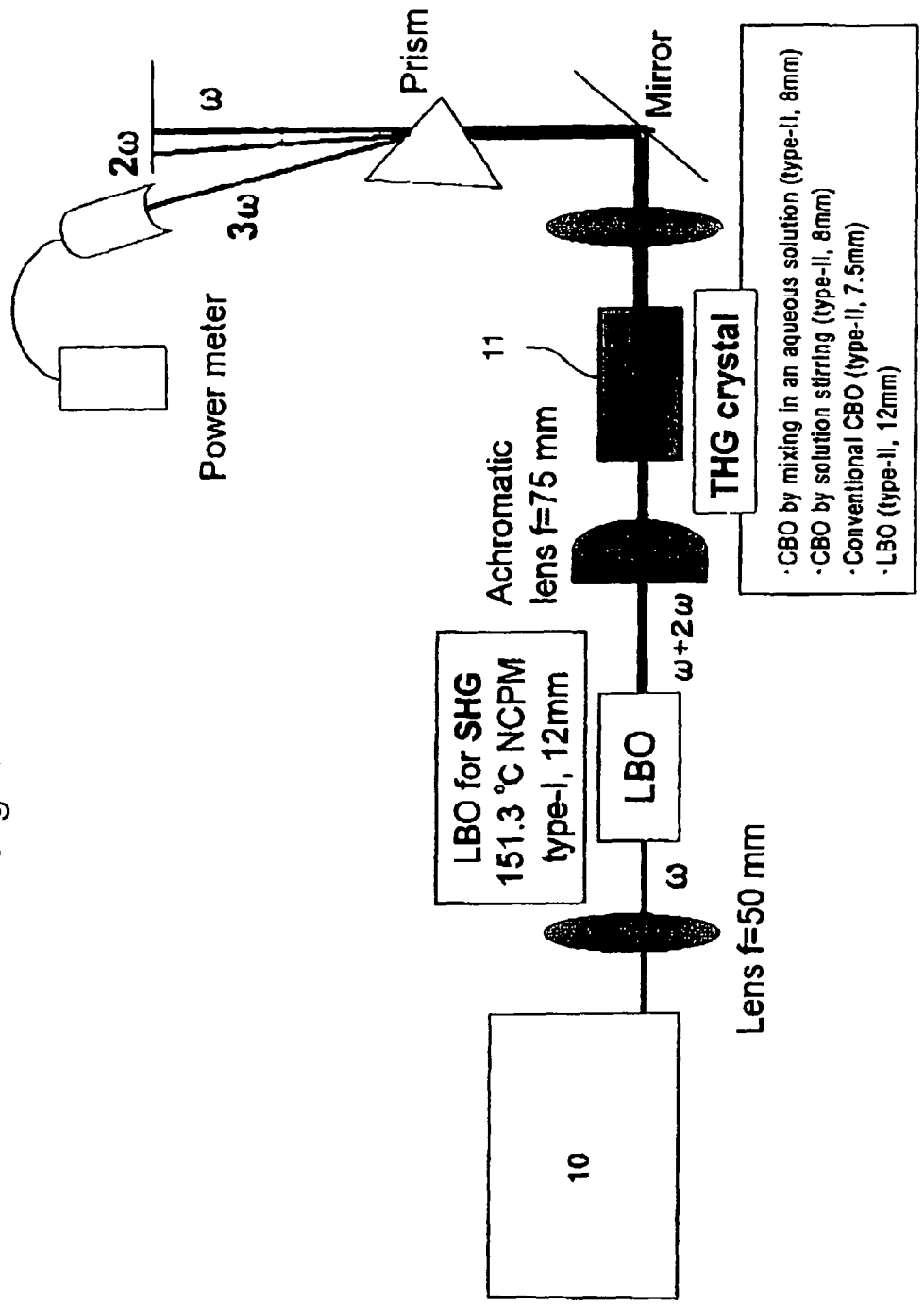
FIG. 6 is a structural view illustrating an apparatus for generating a third harmonic of a wavelength 1064 nm utilizing a cesium-borate-based crystal produced by the method of the invention.

This single crystal was used as a nonlinear optical crystal. As shown in FIG. 6, 4 types of nonlinear optical crystals (11) including the CBO crystal produced by mixing in an aqueous solution, the CBO crystal produced by solution stirring, a CBO crystal produced by a conventional method, and an LBO crystal were used for wavelength conversion of a laser light having an wavelength of 1064 nm and a repetition frequency of 31.25 kHz generated from a laser light source of an Nd:YVO₄ laser (10) (LIGHTBOOK2010). Thus generated third harmonics were split by a prism, and the output thereof was detected by a power meter.

Figure 7:
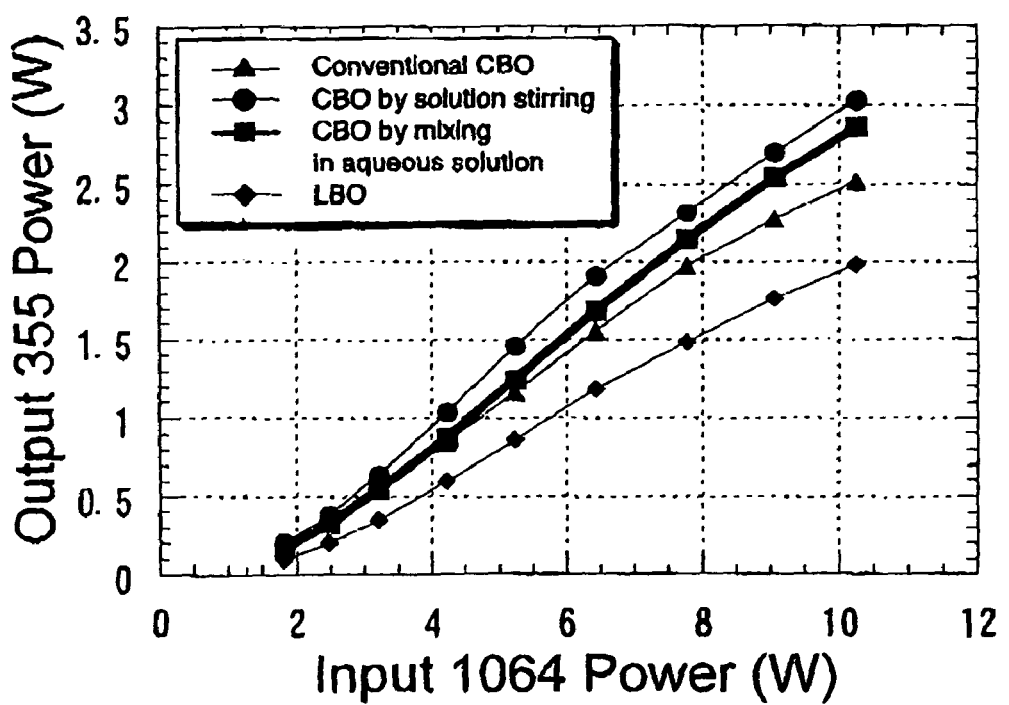
FIG. 7 is a graph showing output power of ultraviolet light of a cesium-borate-based crystal produced by the method of the invention.

The results are shown in the graph of FIG. 7. As shown in FIG. 7, though the CBO crystal produced by mixing in aqueous solution according to the invention showed output of 355 nm ultraviolet light generation lower than that of the CBO crystal produced by solution stirring, it has a laser damage threshold of 110 MW/cm² or more, higher than the laser damage threshold of the conventional CBO crystal which is 60 MW/cm² or more, and the laser damage threshold of the LBO crystal which is 80 MW/cm² or more, showing that the CBO crystal of the invention suffered less laser damage than the conventional CBO crystal. Further, the CBO crystal of the invention had the maximum output of 2.9 W, and had a conversion efficiency 1.44 times as high as that of the LBO crystal, showing that it is high-quality.

Example 3

In a conventional CLBO crystal growth, because a large amount, 6 kg, of starting materials are used and swelling is caused due to decarboxylation in the heating step, Cs₂CO₃, Li₂CO₃, and B₂O₃ powders are charged in a platinum crucible without mixing and firing, and then heated to 900° C. and melted, to obtain a growth solution. In this case, it is likely that in the heating process, B₂O₃ having the lowest melting point among the starting materials is melted first, and CiCO₃ and Li₂CO₃ melt into the B₂O₃. Thus, it is expected that, when nonuniformly mixed starting materials are melted, the high-viscosity boric add-based starting material does not readily diffuse, local regions with a high Cs or Li content are generated, and the composition and structure of CLBO required for the crystal growth are not easily formed.

Figure 8:
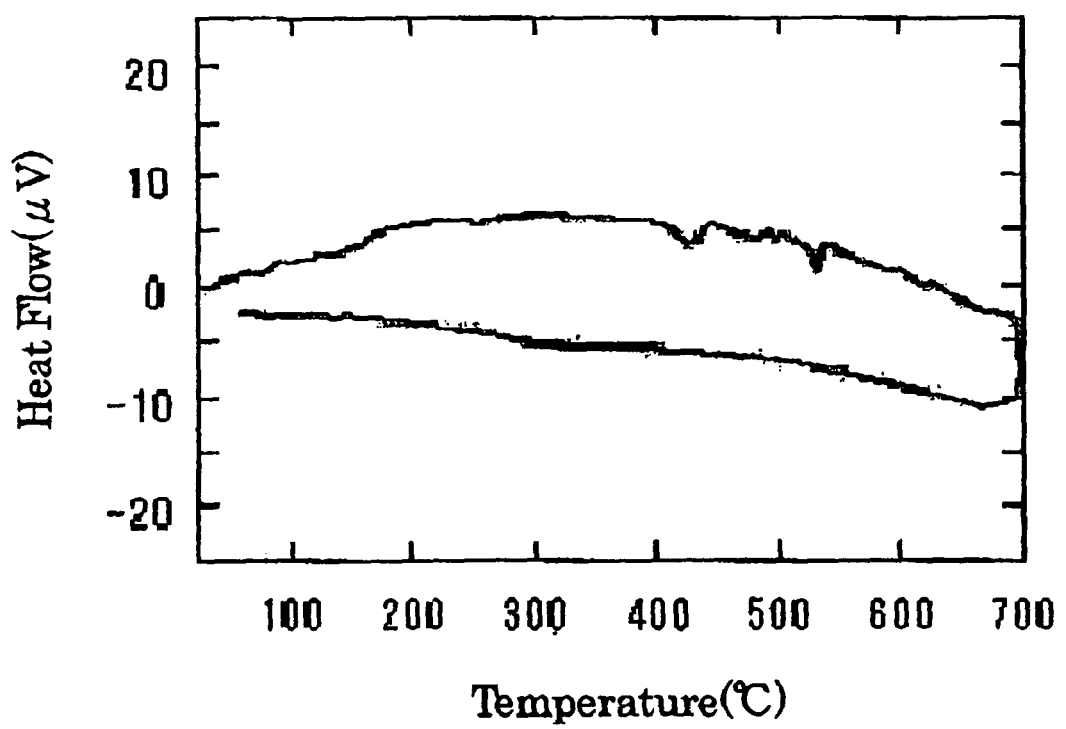
FIG. 8 is a view illustrating the results of DTA of conventional CLBO crystal materials mixed in a mortar.

Therefore, the inventors tried to form a CLBO crystal phase by firing the starting material. The starting materials were stoichiometrically weighed, mixed in a mortar, and subjected to a differential thermal analysis (DTA). The heating speed was 10° C./nin, and the temperature was raised to 700° C. As a result, endothermic reactions were observed at about 430° C. and 540° C. as shown in FIG. 8. The endothermic reaction around 430° C. seems to have been the melting of B₂O₃, and that around 540° C. seems to have been the synthesis of CsLiB₆O₁₀ (CLBO).

Figure 9:
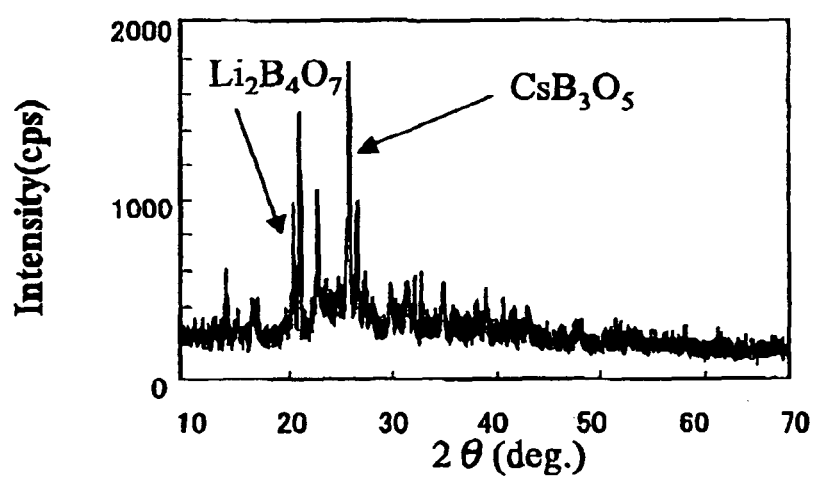
FIG. 9 is a view illustrating the results of powder X-ray diffraction measurement of the sample of FIG. 8 after DTA.
Figure 10:
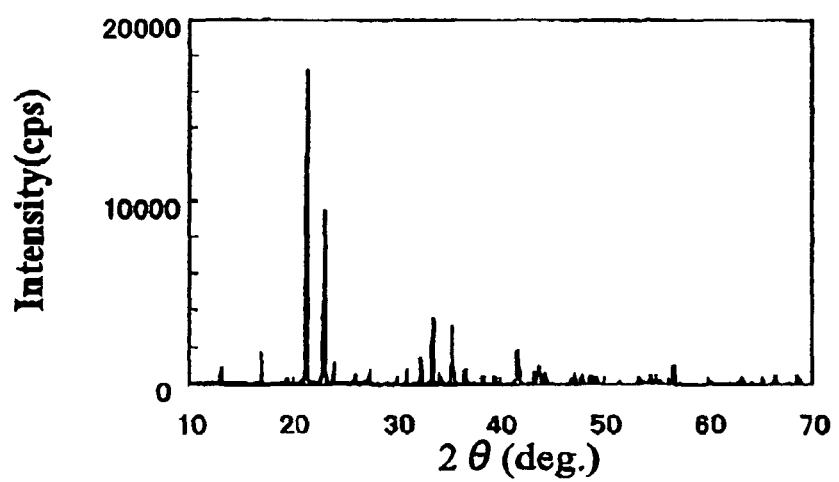
FIG. 10 is a view illustrating X-ray diffraction peaks of a CLBO crystal

The starting materials after DTA were subjected to powder X-ray diffraction measurement, and the results shown in FIG. 9 were obtained. In FIG. 9, not only diffraction peaks of CLBO but also peaks of impurities such as CsB₃O₅ and Li₂B₄O₇ were observed, the diffraction peaks of CLBO being shown in FIG. 10. It is considered that the mortar mixing produces only limited miniaturization and uniformization, and composition unevenness is locally generated in the starting materials so that impurities are formed. Thus, a method for the miniaturization and uniformization of the starting materials was sought.

The CLBO crystal is deliquescent and the sting material components are hygroscopic, and thus it has been considered that the starting materials are desirably weighed and mixed under low humidity. The inventors considered these properties from a different angle, and dissolved the starting materials in water to utilize this hygroscopicity according to the method of the invention, to achieve minute and uniform mixing. When 100 g of starting materials weighed stoichiometrically were introduced into about 500 ml of water, they were dissolved while generating bubbles. After the generation of the bubbles, the resulting aqueous solution was colorless and transparent, indicating that the starting materials were completely dissolved. When dissolved in water, B₂O₃ is converted to boric acid, and Cs₂CO₃ and Li₂CO₃ show alkaline properties. Thus, a neutralization reaction seems to occur. The bubbles are generated by decarboxylation of Cs₂CO₃ and Li₂CO₃ in this reaction, and it is likely that the carbonic acid compounds in the starting materials completely disappear, because the amount of the B₂O₃ is sufficient for converting the carbonic add compounds to boric acid compounds. When the aqueous solution was subjected to evaporation and dried, white powder was obtained.

Figure 11:
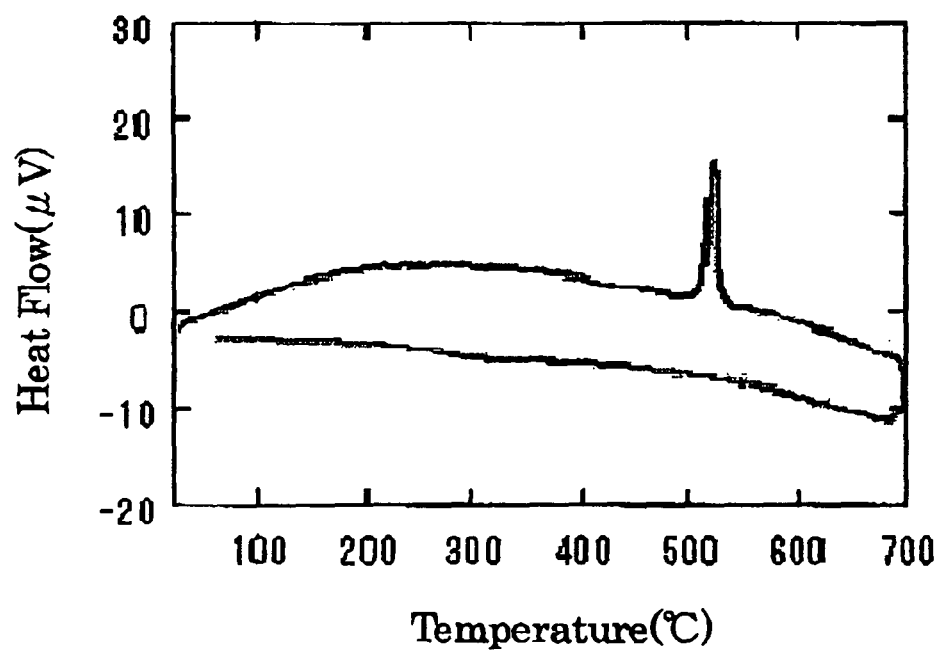
FIG. 11 is a view illustrating the results of DTA of a crystal growth material according to the method of the invention.
Figure 12:
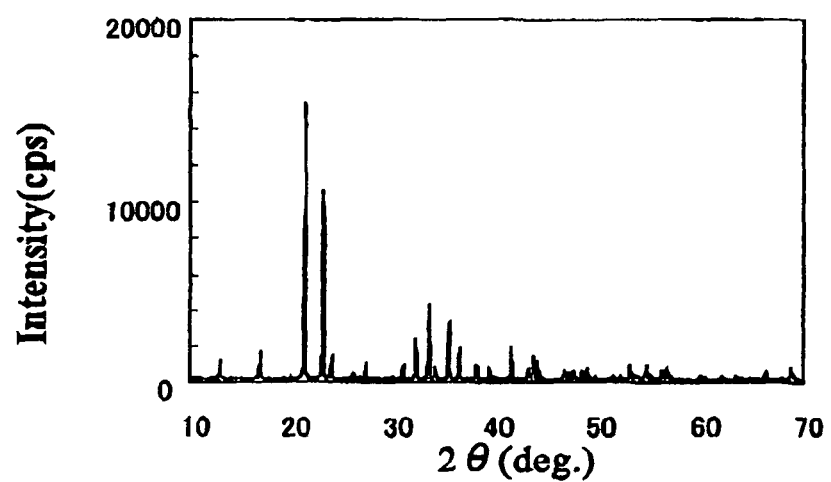
FIG. 12 is a view illustrating the results of powder X-ray diffraction measurement of the sample after DTA of FIG. 11.

The powder was subjected to DTA in the same manner as above. As a result, an exothermic reaction was observed around 540° C. as shown in FIG. 11. The powder after DTA was subjected to powder X-ray diffraction measurement, and as a result only the peaks of CLBO were observed without the peaks of above impurities as shown in FIG. 12. It is concluded that the starting materials are miniaturized and uniformized by the mixing in the aqueous solution. In the case of the (211) face and where 2θ=21.38°, at which the maximum diffraction peak in the CLBO phase is obtained, the very large peak intensity of about 16000 cps was obtained, whereas the sintered body produced from the conventionally prepared starting materials had intensity of 1500 cps. This seems to be because the synthesis reaction of the following formula is accelerated by decarboxylation.

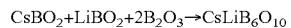

CsBO₂+LiBO₂+2B₂O₃→CsLiB₆O₁₀

Based on these results, a crystal growth material was prepared in the following manner. Commercially available Cs₂CO₃ with a purity of 4 N, Li₂CO₃ with a purity of 3 N, and B₂O₃ were used am starting materials. To grow a crystal by a TSSG method, 6 kg of the starting materials are prepared as a self-flux composition at a mole ratio of Cs₂CO₃:Li₂CO₃:B₂O₃=1:1:5.5, the amount of B₂O₃ being slightly reduced. The weighed starting materials were dissolved in about 6 L of distilled water, subjected to evaporation, and dried, and the obtained powder was fired at 800° C. for 24 hours. Here because decarboxylation was executed in the step of dissolving in water, swelling was not caused as in the case of the conventionally prepared starting materials. A part of the obtained crystal growth material (a sintered body) was subjected to powder X-ray diffraction measurement, and as a result, a single CLBO phase was observed. Then, the material was heated to 900° C. to obtain a melt.

Crystal growth was carried out by using a five-layer-control cylindrical resistance heating furnace (5) shown in FIG. 2. The orientation of a seed crystal (7) was the a-axis, and the seed crystal (7) was rotated at 30 rpm to stir the solution, with the rotating direction reversed every 3 minutes. The growth starting temperature was 842.5° C., and the temperature reduction was at about 0.05 to 0.1° C./day. The size of the grown crystal was 51 mm×35 mm×25 mm (a-axis×c-axis×a- axis), the average growth speed was 3.6 mm/day in the a-axis direction (the horizontal direction), the growth period was 14 days, and the weight was 47 g. The growth speed and the crystal shape were equal to those of a conventional crystal growth material, so that it was clear that the crystal growth material prepared by mixing in an aqueous solution according to the invention had no particular adverse effects on the crystal growth. The scattering in the crystal was investigated using an He—Ne laser, and as a result scattering was not observed.

Figure 13:
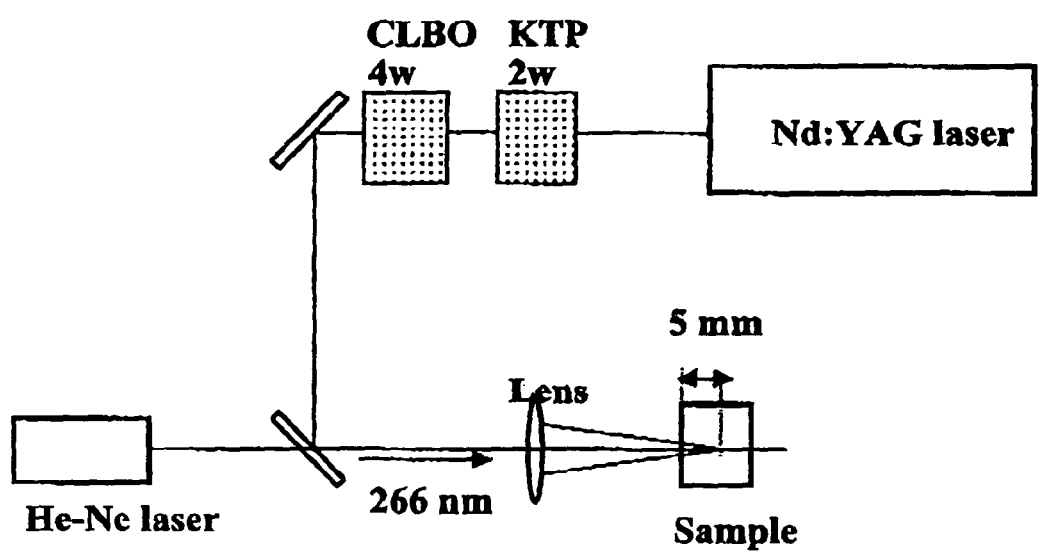
FIG. 13 is a schematic view illustrating the structure of an optical system for measuring a damage threshold for an ultraviolet laser light.
Figure 14:
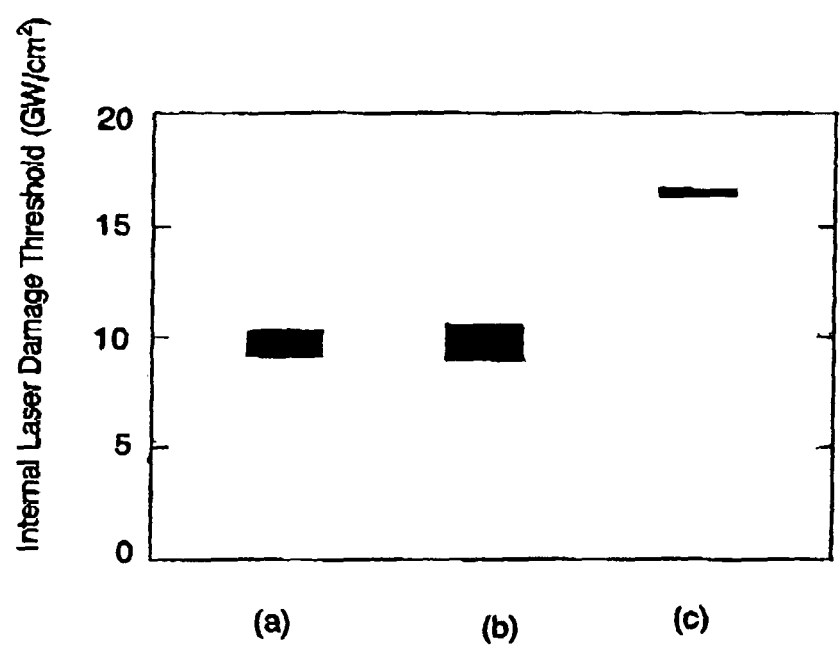
FIG. 14 is a view illustrating the results of measuring laser damage thresholds of (a) fused quartz, (b) a conventional crystal, (c) a crystal produced by the method of the invention.

Then, to compare the qualities of the crystal formed from the material prepared by mixing in aqueous solution with the crystal formed from the conventional material, the ultraviolet laser light damage threshold was measured by the following method. A c-axis plate element having a thickness of 1 cm was cut from the crystal, and both end surfaces were optically polished. One Pulse of a laser light (wavelength 266 nm, pulse width 7 ns) was focused on the CLBO device by an optical system shown in FIG. 13, and the presence or absence of damage was determined. The damage resistance was obtained by a 1-on-1 method, changing the irradiation position every shot. The obtained results are shown in FIG. 14. The laser damage threshold of (b) the crystal obtained from the conventionally prepared starting materials was 8.8 to 10.4 GW/cm$^2$, about the same as that of (a) fused quartz (manufactured by Shin-Etsu Quartz Products Co., Ltd.). (c) The crystal obtained from the starting materials by first mixing them in an aqueous solution had a laser damage threshold of 16.2 to 16.6 GW/cm$^2$, which was about 1.6 times as large as that of (a) the fused quartz, and thus it was clear that the crystal had remarkably improved laser damage resistance compared with (b) the conventional crystal. Further, the crystal of (c) had an extremely narrow threshold distribution width of approximately 1.0 GW/cm$^2$ as compared to 3.2 GW/cm$^2$ of (b) the conventional crystal, also indicating that the uniformity inside the crystal was improved. It has been found by past investigation that CLBO crystals with high laser damage resistance have poor dislocation density, so it may be concluded that the grown crystal produced by mixing in aqueous solution has improved qualities.

Figure 15:
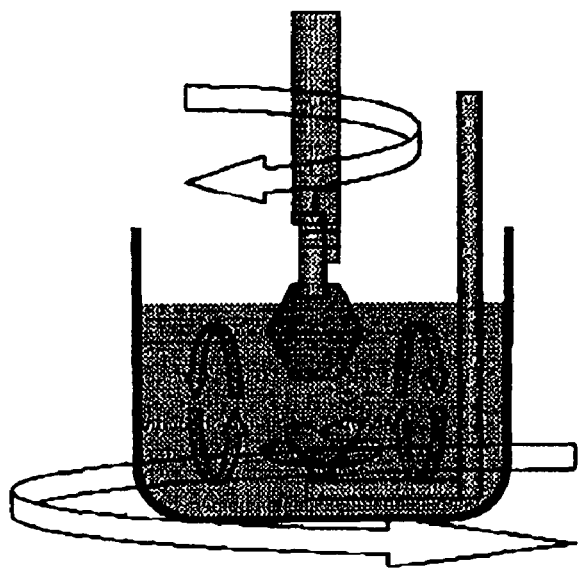
FIG. 15 is a view illustrating an embodiment of stirring a solution for crystal growth.
Figure 16:
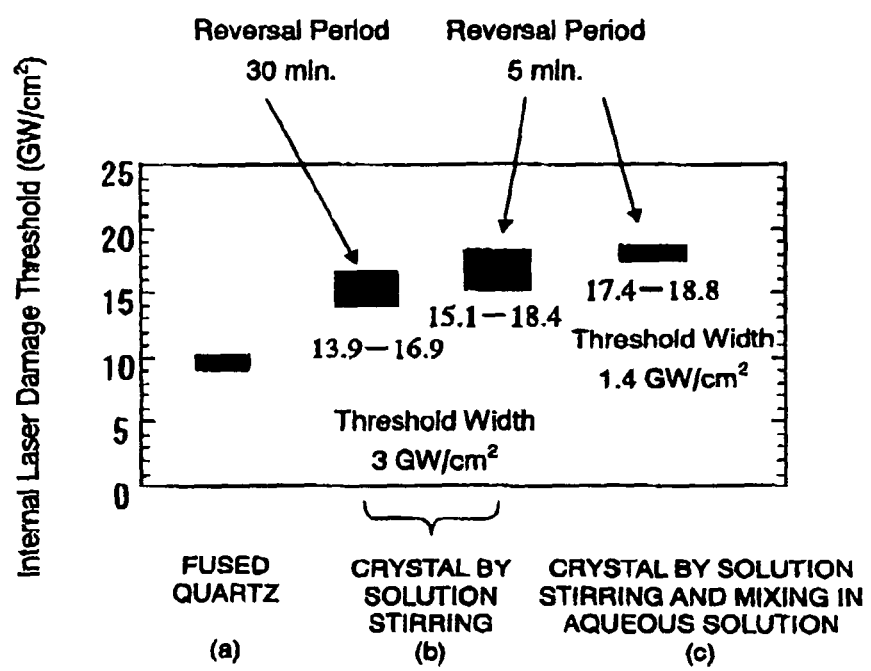
FIG. 16 is a view illustrating the results of property measurement of a sample stirred as shown in FIG. 15.

In the crystal growth, the melt was stirred by rotating the crystal and the crucible in the opposite directions without rotating a blade part introduced into the melt as shown in FIG. 15. The laser damage threshold of thus obtained crystal is shown in FIG. 16. (a) represents the laser damage threshold of the comparative example fused quartz. As is clear from FIG. 16, (c) the crystal grown from the material by first mixing in aqueous solution according to the invention has uniformity and laser resistance higher than those of (b) the crystal grown from the conventionally prepared starting materials.

Figure 17:
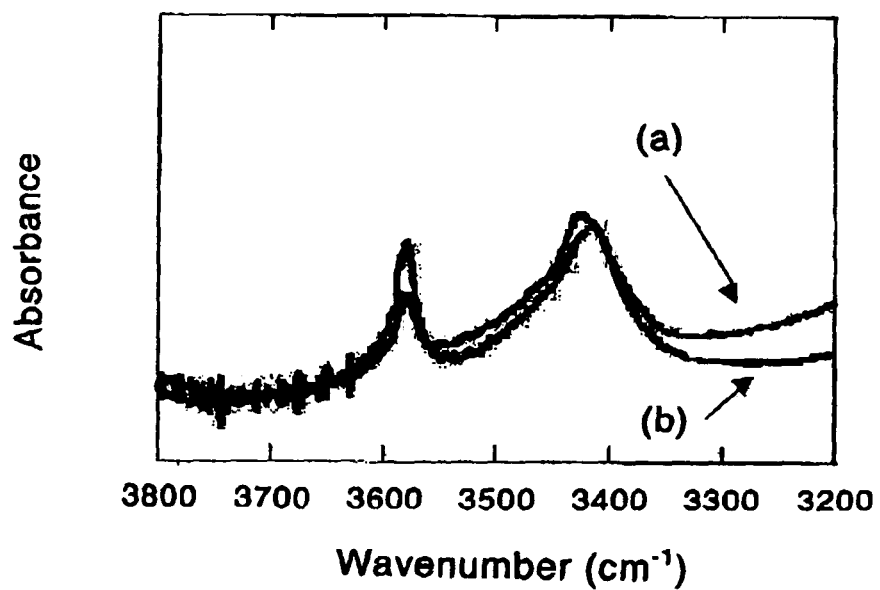
FIG. 17 is a view illustrating the results of evaluating the OH group content of a CLBO crystal by an FA-IR absorption spectrum method.

It has been confirmed by a Fourier transform infrared (FT-IR) absorption spectrum method that the CLBO crystal has many OH groups inside the crystal structure. Further, it has been reported that the transmittance of ultraviolet light is lowered as the number of the OH groups in the crystal is larger. There was a fear that more OH groups were incorporated into the crystal grown from the starting materials by mixing in aqueous solution as compared to the conventional crystal, and thus the OH group contents were evaluated by the Fourier transform infrared (FT-IR) absorption spectrum method. It has been reported that the absorption spectrum of the OR groups in the CLBO crystal is more noticeably shown in the c-axis direction than in the a-axis direction. Thus, a 1-mm-thick c-axis plate was cut from both (a) the crystal grown from the conventionally prepared starting materials and (b) the crystal grown from the starting materials by mixing in aqueous solution to obtain evaluation samples. Each crystal was heated at 150° C. for about 1 day to remove water molecules adsorbed to the surface, and then measured with respect to the c-axis. The incident infrared light was without polarization. The results are shown in FIG. 17. The peaks of approximately 3400 cm$^{-1}$ and 3600 cm$^{-1}$ represent absorbance due to the OH groups. It is clear from the results that (a) the conventional crystal and (b) the crystal from the starting materials by mixing in aqueous solution had the same absorption spectrum intensity. Thus, the number of the OH groups in the starting material powder dissolved in water was reduced to that of the conventional material by evaporating, drying, and firing.

Example 4

A single CLBO crystal produced by the method of the invention was cut into three samples with a length of 10 mm in the direction of $(\Theta, \Phi)=(61.9°, 45°)$, and optically polished. The angle is phase matching angle for Type I fourth harmonic generation for the Nd:YAG laser.

Figure 18:
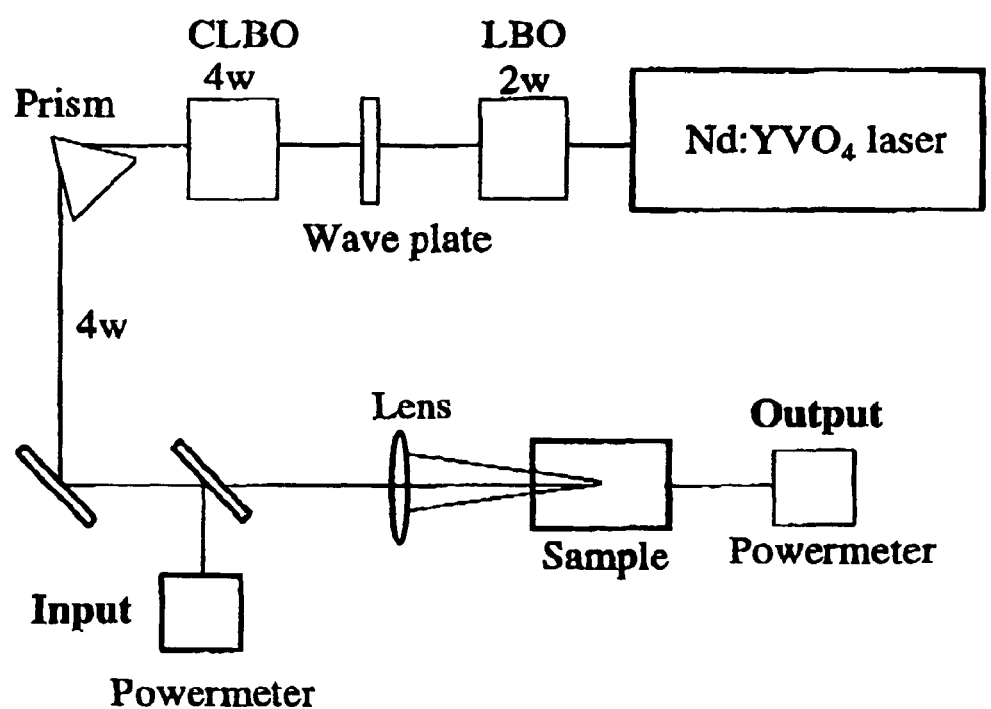
FIG. 18 is a schematic view illustrating the structure of an optical system for measuring an internal damage threshold for an ultraviolet laser light.

The structure of an optical system for measuring the ultraviolet laser light internal damage threshold is schematically shown in FIG. 18. As shown in FIG. 18, a diode pumping Nd:YVO$_4$ laser was used as a light source, the pulse repetition frequency was 31.25 kHz, and the output pulse width was 10 ns in a TEM$_{00}$ mode. Further, a Type I LBO crystal with a length of 12 mm was used to generate second harmonics at a high temperature of 148° C. under noncritical phase matching conditions. The first of the above CLBO crystals was used to generate fourth harmonics at a high temperature of 150° C. Thus generated ultraviolet laser light (266 nm) was concentrated on the second CLBO crystal (Sample) heated to 150° C. The spot size of the fourth harmonics was approximately 16 μm. The output of the ultraviolet laser light can be changed by a computer-controlled phase difference plate. The measurement was carried out as follows. The ultraviolet laser light output was controlled at 0.6 GW/cm$^2$, which was sufficiently lower than the damage threshold, and continuously increased until the transmittance was rapidly reduced. The threshold was defined as the output intensity where there was rapid reduction (breakdown) of the transmittance.

Figure 19:
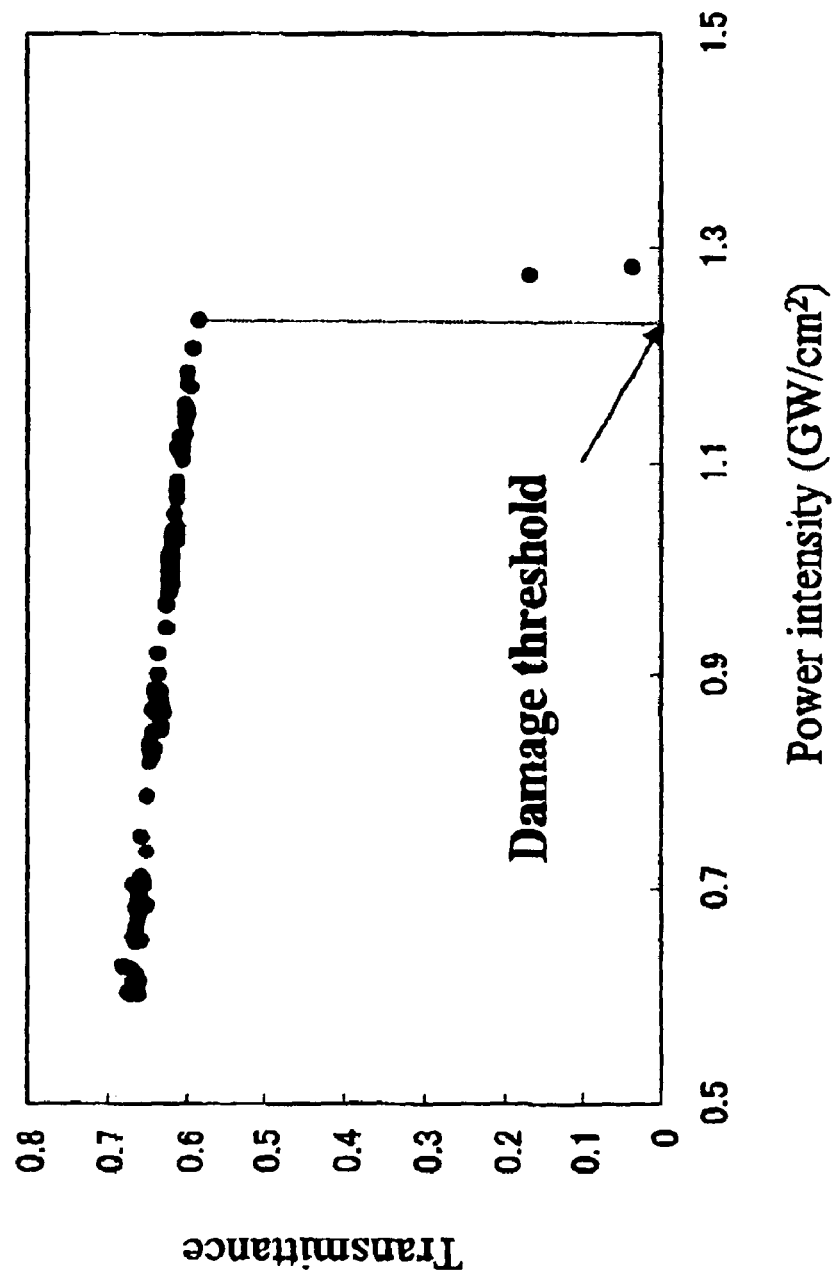
FIG. 19 is a view illustrating the results of measuring internal laser damage threshold of a CLBO crystal heated at 150° C. under multi-pulse irradiation.

FIG. 19 shows an example of the results of measuring the laser internal damage threshold of a CLBO crystal heated at 150° C. under multi-pulse irradiation. The average internal laser damage threshold of five portions of the CLBO crystal was about 1.2 GW/cm$^2$. This value was 1 order of magnitude less than the threshold for 266 nm single pulse irradiation (about 12 GW/cm$^2$).

Figure 20:
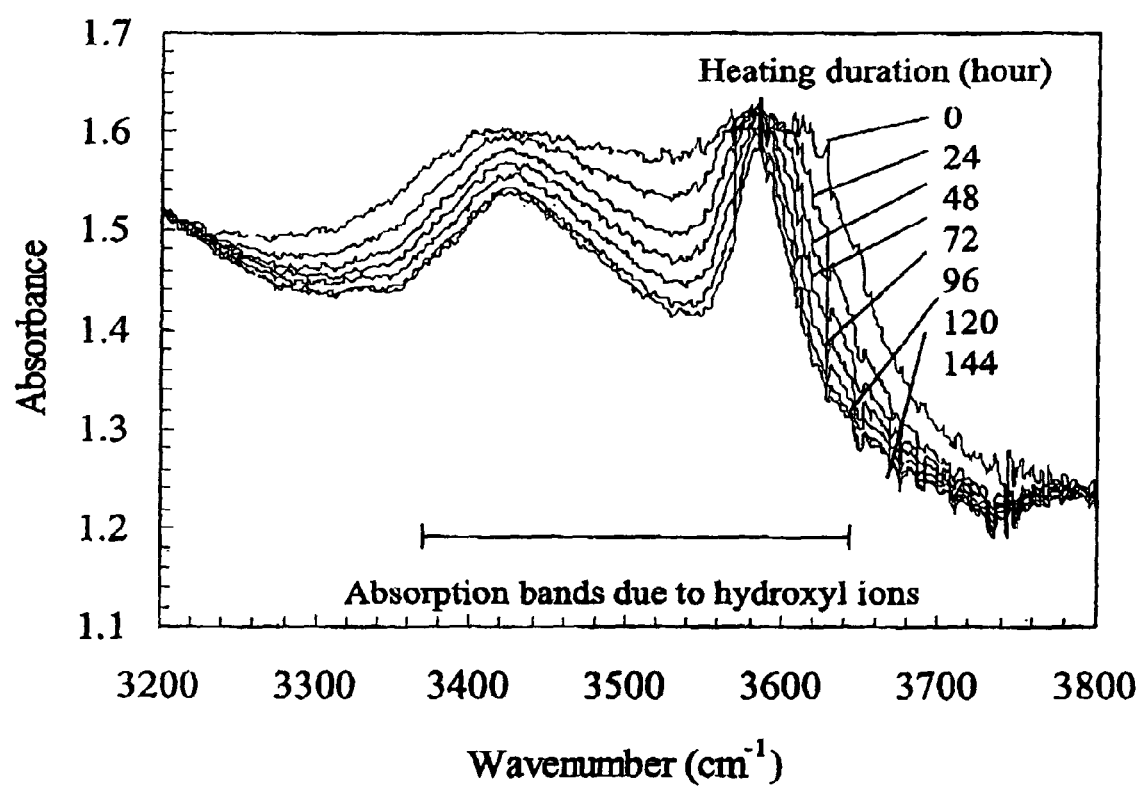
FIG. 20 is a view illustrating the results of measuring the OH group content of a CLBO crystal heated to 150° C. by an FT-IR absorption spectrum method.

The water impurity in the CLBO crystal can be reduced to a certain level by heating at 100° C. or more for several days. Thus, the water impurity amount change under heating at 150° C. of the third CLBO crystal prepared beforehand was measured using as an indicator toe hydroxide ion (OH) absorption band change, measured by a Fourier transform infrared (FT-IR) spectrometer. The absorption bands due to the hydroxide ions in the CLBO crystal are approximately 3400 cm$^{-1}$ and 3600 cm$^{-1}$, so the absorption spectrum was measured within the range of 3200 to 3800 cm$^{-1}$ every 24 hours until the absorption band change was saturated. The results are shown in FIG. 20. It was confirmed that the intensity of the absorption band at approximately 3400 cm$^{-1}$ and 3600 cm$^{-1}$ was gradually reduced by heating and saturated in 120 hours.

Figure 21:
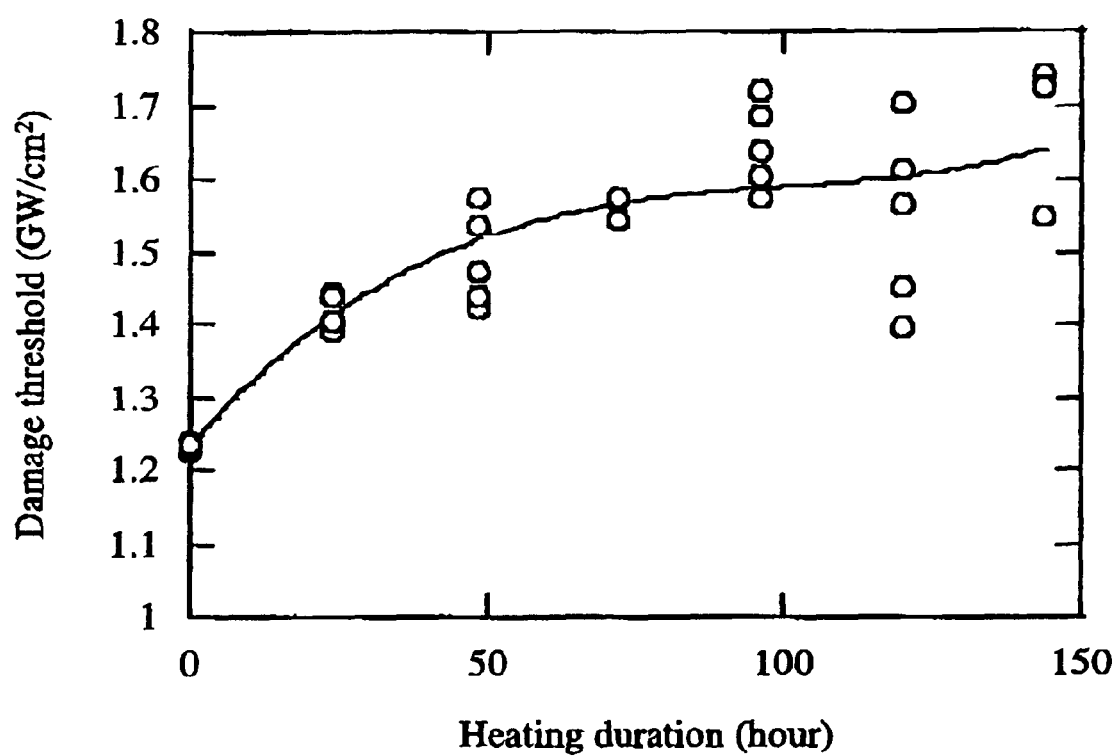
FIG. 21 is a view illustrating the results of measuring the internal laser damage threshold of a CLBO crystal heated to 150° C.

The internal laser damage threshold of several portions of the CLBO crystal was measured every 24 hours under the same heating conditions. The results are shown in FIG. 21. The internal laser damage threshold was gradually increased by heating, and saturated in about 120 hours. The resultant threshold was about 1.35 times the initial value. Further, it was found that the gradual reduction of the transmittance shown in FIG. 19 in the range below the threshold was reduced with increase in the time the crystal was heated.

It is clear from these results that the hydroxide ions, i.e. the water impurities is related to nonlinear absorbance of the CLBO crystal, and that the internal laser damage threshold can be improved by removing the hydroxide ions in the CLBO crystal.

The method of removing the hydroxide ion impurities from the crystal is not limited to mere heating, and a gas substitution apparatus, an evacuation apparatus, etc. or a combination of the above may be used.

The invention is not limited to above Examples, and it will be obvious that various changes may be made in the details.

INDUSTRIAL APPLICABILITY

As described in detail above, according to the present invention, there is provided a novel method for producing a borate-based crystal which is capable of producing a more uniform and reliable borate-based crystal useful as a optical wavelength conversion device, etc., at low cost in a short period of time, and a laser oscillation apparatus using the crystal as an optical wavelength conversion device.

The invention claimed is:

1. A method for producing a borate-based crystal, which comprises:
   employing a water-soluble cesium compound and a water-soluble boron compound as starting materials,
   dissolving all of the starting materials simultaneously in an amount of water which is 1.0 to 2.5 times the total weight of the starting materials,
   forming an aqueous solution with a uniform composition,
   evaporating the water in the aqueous solution, followed or not followed by sintering, to form a crystal growth material,
   melting the crystal growth material, and
   growing a cesium-borate-based crystal of the composition formula:

$Cs_{1-x}M_xB_3O_5 \, (0 \leq x < 1)$ wherein M is an alkaline metal or alkaline earth metal element,
   wherein the water-soluble cesium compound is a cesium carbonate compound, and
   wherein a decarboxylation reaction occurs in the aqueous solution by dissolving the starting materials in water.

2. The method for producing a borate-based crystal according to claim 1, wherein the water-soluble boron compound is boron oxide or boric acid.

3. The method for producing a borate-based crystal according to claim 1, wherein the aqueous solution is heated to evaporate the water.

4. The method for producing a borate-based crystal according to claim 1, wherein the sintering is carried out within a temperature range of 500° C. or higher and lower than the melting temperature after evaporating the water in the aqueous solution.

5. The method for producing a borate-based crystal according to claim 1, wherein a melt of the crystal growth material is stirred during the crystal growth.

6. The method for producing a borate-based crystal according to claim 1, wherein the grown crystal is heated to reduce a water impurity in the crystal.

7. The method for producing a borate-based crystal according to claim 6, wherein the grown crystal is heated at 100° C. or higher.

8. The method for producing a borate-based crystal according to claim 6, wherein the grown crystal is heated in a gas-substituted atmosphere or an evacuated atmosphere.

* * * * *